United States Patent [19]
Wincn

[11] Patent Number: 5,600,321
[45] Date of Patent: Feb. 4, 1997

[54] HIGH SPEED, LOW POWER CMOS D/A CONVERTER FOR WAVE SYNTHESIS IN NETWORK

[75] Inventor: John M. Wincn, Cupertino, Calif.

[73] Assignee: Advanced Micro Devices Inc., Sunnyvale, Calif.

[21] Appl. No.: 482,113

[22] Filed: Jun. 7, 1995

[51] Int. Cl.⁶ ........................................... H03M 1/66
[52] U.S. Cl. ............................... 341/144; 341/135
[58] Field of Search ................................. 341/144, 136, 341/153, 154; 323/316

[56] References Cited

U.S. PATENT DOCUMENTS

| | | |
|---|---|---|
| 4,393,370 | 7/1983 | Hareyama .......................... 341/136 |
| 5,148,164 | 9/1992 | Nakamura et al. . |
| 5,254,994 | 10/1993 | Takakura et al. . |
| 5,276,716 | 1/1994 | Wincn . |
| 5,331,322 | 7/1994 | Cha et al. . |
| 5,357,145 | 10/1994 | Segaram . |
| 5,446,457 | 8/1995 | Ryat .................................. 341/136 |

Primary Examiner—Brian K. Young
Attorney, Agent, or Firm—Townsend and Townsend and Crew LLP

[57] ABSTRACT

A high speed low power digital-to-analog (D/A) converter (DAC) includes a plurality of least significant bit (LSB) cells that collectively define a total output of the DAC. Each LSB cell includes a differential current driver that has reduced capacitive loading due to a cascode structure of the current driver wherein transistors are biased to desired levels and current sources are switched on and off to control the differential output signal.

12 Claims, 3 Drawing Sheets

HIGH SPEED, LOW POWER CMOS D/A CONVERTER FOR WAVE SYNTHESIS IN NETWORK

CROSS-REFERENCE TO RELATED APPLICATIONS

This application is related to "HIGH SPEED MOS D/A CONVERTER FOR WAVE SYNTHESIS IN NETWORK," U.S. patent application Ser. No. 08/458,969 filed Jun. 2, 1995 and "A PRECISE DELAY LINE CIRCUIT WITH PREDETERMINED RESET TIME LIMIT," U.S. patent application Ser. No. 08/214,897 filed Mar. 17, 1994, both hereby expressly incorporated by reference for all purposes.

BACKGROUND OF THE INVENTION

The present invention relates generally to semiconductor integrated circuits and more specifically to integration of waveshaping functions into an integrated circuit that drives a differential signal onto a local area network.

U.S. Pat. No. 5,357,145 titled Integrated Waveshaping Circuit Using Weighted Current Summing and Issued Oct. 18, 1994 describes relevant background for understanding the present invention, as well as describing one conventional solution to on-chip wave synthesis.

Various network protocols such as IEEE Standards 802.3 (Ethernet) and 10Base-T (twisted pair), both hereby expressly incorporated by reference for all purposes, define operational characteristics for various data signals. To implement a data transmitter for twisted pair wiring using an integrated circuit solution, many conventional systems rely on external filter elements to properly shape the output wave.

U.S. Pat. No. 5,357,145, hereby expressly incorporated by reference for all purposes, illustrates a solution to wave shaping incorporating a weighted sum solution that provides an output waveform designed to represent a shape of an output signal after it has passed through a filter. The solution disclosed in the U.S. Pat. No. 5,357,145 provides a plurality of current cells that are controlled in a fashion so that output contributions of the various cells provide the desired wave shape. Generically, this conversion process defines a digital to analog (D/A) converter or DAC implementation.

For effective operation, construction and control of the current cells is important to provide a robust, fast, and reliable D/A converter for use in waveform synthesis. The solution described in U.S. Pat. No. 5,357,145 provides a current cell that may have excessive parasitic capacitance that can limit an operational speed of the D/A converter. Some implementations of a DAC consume excessive power. In some of these embodiments, it may be desirable to have reduced power DAC.

SUMMARY OF THE INVENTION

The present invention provides apparatus and method for simply, efficiently and economically improving performance over conventional D/A converters. The preferred embodiment provides an improved performance partially because of a decrease in capacitive loading of current output drivers used in least significant bit cells making up the improved D/A converter and has a lower power consumption than previous versions of DACs. Thus, the improved D/A converter may be faster and produce less distortion while consuming less power than conventional D/A converters.

According to one aspect of the invention, a low power least significant bit (LSB) cell for an integrated digital to analog converter that drives an incremental current at each of a first and a second output node, includes a first pair of a first and second matching MOS transistor, each having a first terminal node, a second terminal node and a gate terminal node, the gate terminal nodes receiving a bias current for controlling an operating current between the first terminal node and second terminal node and wherein the first terminal node of the first MOS transistor is coupled to the first output node and the first terminal node of the second MOS transistor is coupled to the second output node. The low power LSB cell includes a first current source having a first current terminal coupled to the second terminal node of the first MOS transistor and a second current terminal coupled to a voltage reference level, the first current source is responsive to a first control signal for switching a first operating current through the first MOS transistor on when the first control signal has a first value and switching the first operating current through the first MOS transistor off when the first control signal has a second value; and a second current source having a first current terminal coupled to the second terminal node of the second MOS transistor and a second current terminal coupled to the voltage reference level, the second current source responsive to a second control signal for switching a second operating current through the second MOS transistor ON when the second control signal has a first value and switching the second operating current through the second MOS transistor OFF when the second control signal has a second value.

The low power LSB cell includes a second pair of a third and fourth matching MOS transistor, each having a first terminal node, a second terminal node and a gate terminal node, the gate terminal nodes receiving a bias current for controlling an operating current between the first terminal node and second terminal node and wherein the first terminal node of the third MOS transistor is coupled to the first output node and the first terminal node of the fourth MOS transistor is coupled to the second output node. The low power LSB cell includes a third current source having a first current terminal coupled to the second terminal node of the third MOS transistor and a second current terminal coupled to a second voltage reference level, the third current source is responsive to a third control signal for switching a third operating current through the third MOS transistor ON when the third control signal has a first value and switching the third operating current through the third MOS transistor OFF when the third control signal has a second value; and a fourth current source having a first current terminal coupled to the second terminal node of the fourth MOS transistor and a second current terminal coupled to the second voltage reference level, the fourth current source responsive to a fourth control signal for switching a fourth operating current through the fourth MOS transistor ON when the fourth control signal has a first value and switching the fourth operating current through the fourth MOS transistor OFF when the fourth control signal has a second value.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

DESCRIPTION OF THE PREFERRED EMBODIMENT

Figure 1:
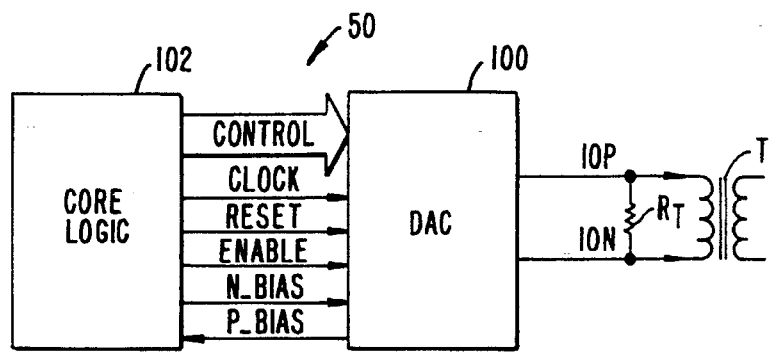
FIG. 1 is a schematic block diagram of a preferred embodiment of a twisted pair transmitter 50 including a high speed, low power, digital to analog converter (DAC) 100 for wave synthesis.

FIG. 1 is a schematic block diagram of a preferred embodiment of a twisted pair transmitter 50 including a high speed digital to analog converter (DAC) 100 for wave synthesis. Twisted pair transmitter includes a core logic circuit 102 that provides a plurality of control signals, an enable signal, a clock signal, a reset signal, and two bias signals (P_BIAS and N_BIAS) to DAC 100. These signals define operation of DAC 100 and control a differential signal driven on a differential output (IOP and ION) of DAC 100. A terminating resistor RT provides termination and couples IOP to ION as well known. Additionally, the differential signal at IOP and ION is provided to a transformer T.

In operation, core logic 102 determines the shape of the differential signal to be driven from the output of DAC 100. As will be explained in further detail later, core logic 102 selects a combination of control signals to drive the output differential signal to the desired level. In order to operate DAC 100, core logic 102 first asserts the enable signal to DAC 100 to enable its operation. With the enable signal deasserted, DAC 100 dissipates very low levels of power irrespective of the status of the control signals and the bias signal.

After asserting the enable signal, core logic 102 asserts the bias signals to DAC 100, and selective ones of the control signals. Assertion of the clock signal synchronizes application of the control signals to current cells within DAC 100. In response to particular combinations of the control signals (while enable and bias are asserted), DAC 100 drives the output differential signal at the desired levels. Details regarding operation of DAC 100 are explained more specifically with regard to FIGS. 2–6 below.

Figure 2:
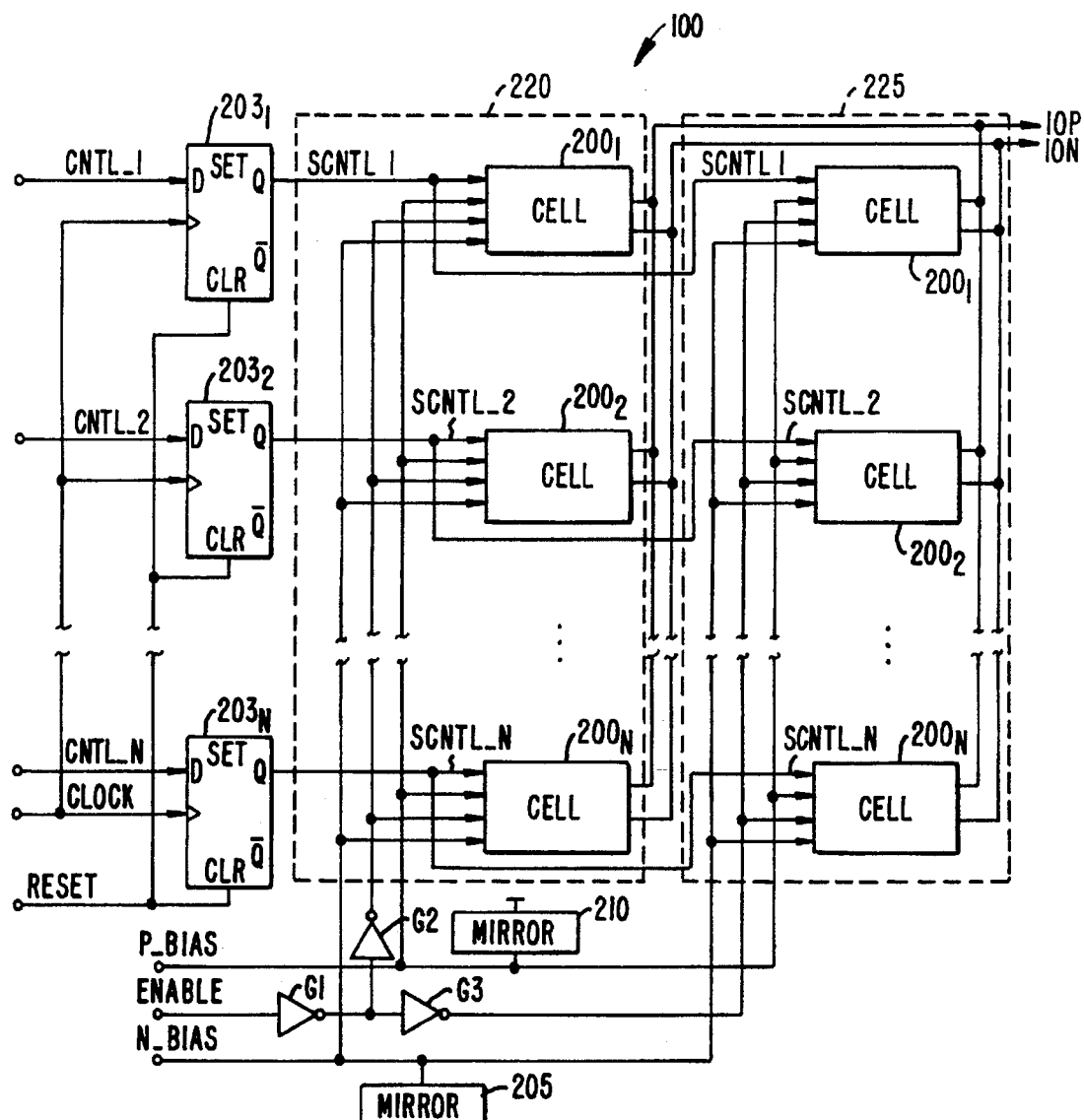
FIG. 2 is a block schematic diagram of DAC 100.

FIG. 2 is a block schematic diagram of DAC 100. DAC 100 includes a plurality of cells $200_i$ that each respond to selected ones of synchronized control signals (SCNTLx) to add a predetermined amount of current to collectively define the differential output signal. The synchronized control signal SCNTLx are output from synchronizers 203x. Synchronizers 203x are implemented, in the preferred embodiment, by D flip-flops that latch a corresponding CNTLx signal as SCNTL signal in response to the clock signal from core logic 102. Additionally, DAC 100 includes a first mirror circuit 205 and a second mirror circuit 210. Mirror circuit 205 is responsive to the N_BIAS signal to establish an N_BIAS mirror current that is provided to each of the plurality of cells $200_i$. Mirror circuit 210 is responsive to the P_BIAS signal to establish a P_BIAS mirror current that is provided to each of the plurality of cells $200_i$. The enable signal is also provided to each of the cells $200_i$. Inverters $G_1$, $G_2$ and $G_3$ delay assertion of the enable signal. Inverter $G_1$ receives the enable signal at its input. Inputs of inverter $G_2$ and inverter $G_3$ are coupled to an output of inverter $G_1$, with an output of inverter $G_2$ driving the delayed enable signal to one-half (in the preferred embodiment) of the plurality of cells $200_i$ and with an output of inverter $G_3$ driving the delayed enable signal to the other one-half of the plurality of cells $200_i$.

Figure 3:
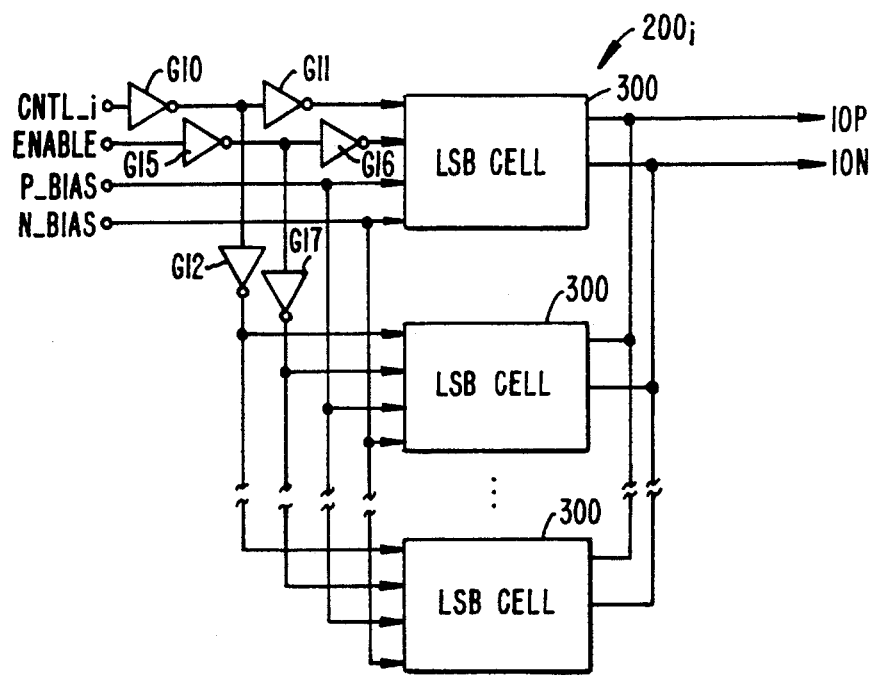
FIG. 3 is a detail block diagram of cell 200i shown in FIG. 2.

Each cell $200_i$ of the preferred embodiment has a slightly different configuration, details of which are explained with regard to FIG. 3. Each cell $200_x$ is responsive to a synchronized control signal SCNTL_X. Each cell 200 thus receives the mirror currents, an enable signal and a synchronized control signal.

In operation, assertion of the bias signals and assertion of the enable signal by core logic 102 shown in FIG. 1 establishes the mirror currents for each cell $200_i$. Asserting the clock signal when all CNTLX signals are in the desired state latches the control signals as the synchronized control signals. Thereafter, depending upon particular ones of the differential control signals asserted by synchronizers 203x, particular ones of the plurality of cells $200_i$ add a predetermined amount of current to the differential output signal. For example in the preferred embodiment, cell $200_1$ may add 10 milliamps (mA), cell $200_2$ may add 6 mA, etc. With enough cells provided to uniquely define the desired output range of DAC 100, the combination of cells 200i produce a simple mechanism to convert input digital signals (the combination of the control signals) into an analog output (the output differential signal at IOP and ION).

In the preferred embodiment, the plurality of cells 200i are divided into two subgroups (220 and 225). These subgroups of cells are provided in parallel to improve layout efficiency when integrated into a semiconductor device. Thus, for specific embodiments, the particular groupings of the plurality of cells 200i may be different. In the preferred embodiment, each subgroup includes two 10 mA cells, one 6 mA cell, three 4 mA cells, two 3 mA cells, two 2 mA cells, and two 1 mA cells. Corresponding cells in the respective subgroups are responsive to the same synchronized control signal. Again, particular embodiments may use different numbers or configurations of cells 200i.

FIG. 3 is a detail block diagram of cell 200i shown in FIG. 2. A particular cell 200i includes one or more least significant bit (LSB) cells 300. LSB cells 300 making up a particular cell 200i are coupled to each other in parallel to receive the synchronized control signal (CNTL_i), the enable signal and the mirror currents. Each LSB cell 300 of the preferred embodiment provides the same amount of drive current. In the preferred configuration illustrated in FIG. 3, each LSB cell 300 provides one-half of the minimum step of DAC 100. In the preferred embodiment, LSB 300 drives one-half milliamp, allowing for a 1 mA cell 200. Inverters $G_{10}$, $G_{11}$ and $G_{12}$, and inverters $G_{15}$, $G_{16}$, and $G_{17}$ provide delay for the synchronized control signal CNTL_X and the delayed enable signal, respectively.

Figure 4:
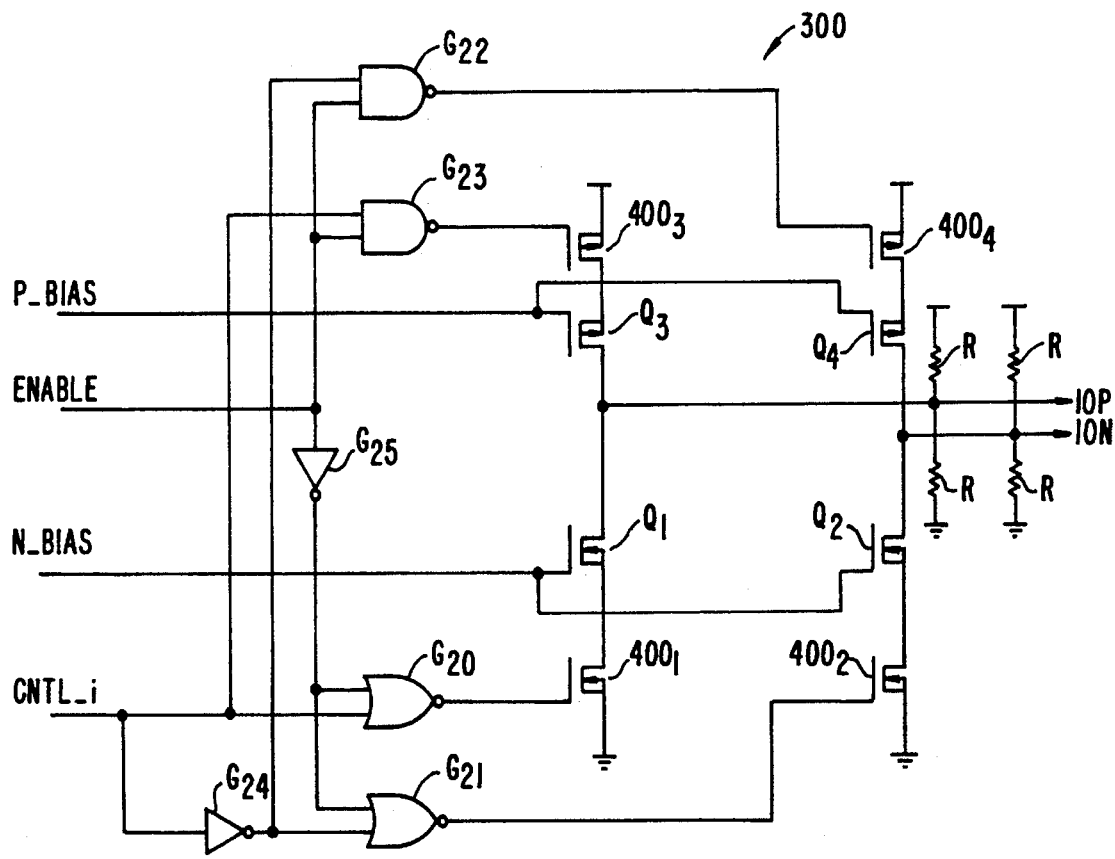
FIG. 4 is a detailed schematic diagram of LSB cell 300 shown in FIG. 3.

FIG. 4 is a detailed schematic diagram of LSB cell 300 shown in FIG. 3. LSB cell 300 includes two N-channel metal oxide field-effect transistors (MOSFETs) Q1 and Q2, two P-channel MOSFETs Q3 and Q4, four switchable current sources $400_i$, two dual-input NOR gates G20 and G21, two dual-input NAND gates G22 and G23, and two inverters G24 and G25. Transistor Q1 and transistor Q2 each include a gate for receipt of the N_BIAS mirror current provided from first mirror circuit 205 shown in FIG. 2. Transistor Q1 and transistor Q2 are, in the preferred embodiment, identical to each other and are scaled relative to a transistor in mirror circuit 205 (as described further below) to produce a preselected current level in response to the bias signal provided from core logic 205 shown in FIG. 2. Transistor Q1 includes a drain coupled to an IOP output port and transistor Q2 includes a drain coupled to an ION output port. A source of transistor Q1 is coupled to a first terminal of one current source $400_1$ and a source of transistor Q2 is coupled to a first terminal of the other current source $400_2$. A second terminal of each of the current sources 400 is coupled to a first reference voltage (e.g., ground). Each current source 400 has a control terminal for receipt of a control signal. Assertion of the control signal to current source $400_1$ results in activation of current source $400_1$. Similarly, assertion of the control signal to current source $400_2$ activates current source $400_2$.

An output of first NOR gate G20 is coupled to the control terminal of current source $400_1$ and an output of second NOR gate G21 is coupled to the control terminal of current source $400_2$. A first input of first NOR gate G20 receives the synchronized control signal while the second input of the first NOR gate G20 receives an output of second inverter G25. The enable signal is provided to the input of inverter G25. A first input of second NOR gate G21 is coupled to an output of first inverter G24, with the input of first inverter G24 coupled to the synchronized control signal input line. The second input of second NOR gate G21 is coupled to the output of second inverter G25.

Transistor Q3 and transistor Q4 each include a gate for receipt of the P_BIAS mirror current provided from second mirror circuit 210 shown in FIG. 2. Transistor Q3 and transistor Q4 are, in the preferred embodiment, identical to each other and are scaled relative to a transistor in mirror circuit 210 (as described further below) to produce a preselected current level in response to the P_BIAS signal provided from second mirror circuit 210 shown in FIG. 2. Transistor Q3 includes a source coupled to the IOP output port and transistor Q4 includes a source coupled to the ION output port. A drain of transistor Q3 is coupled to a first terminal of a third current source $400_3$ and a drain of transistor Q4 is coupled to a first terminal of the fourth current source $400_4$. A second terminal of each of the current sources $400_3$ and $400_4$ is coupled to a second reference voltage (e.g., Vdd). Each current source $400_3$ and $400_4$ has a control terminal for receipt of a control signal. Assertion of the control signal to current source $400_3$ results in activation of current source $400_3$. Similarly, assertion of the control signal to current source $400_4$ activates current source $400_4$.

An output of second NAND gate G23 is coupled to the control terminal of current source $400_4$ and an output of first NAND gate G22 is coupled to the control terminal of current source $400_4$. A first input of second NAND gate G23 receives the synchronized control signal while the second input of the second NAND gate G23 receives the enable signal. A first input of first NAND gate G22 is coupled to the output of first inverter G24. The second input of first NAND gate G22 is coupled to the enable signal.

Four impedances (resistors R) are coupled to the output of LSB 300. A first resistor R is coupled between the second voltage reference and IOP, a second resistor R is coupled between the second voltage reference and ION, a third resistor R coupled between IOP and the first voltage reference and a fourth resistor R coupled between ION and the first voltage reference. In the preferred embodiment, resistors R must be very large in relation to a terminating resistor $R_T$ (shown in FIG. 1). Resistors R may be integrated into the DAC 100 or provided externally.

In operation, assertion of the N_BIAS mirror current to transistor Q1 and to transistor Q2 attempts to establish a scaled current from either IOP or ION to the first voltage reference level, and assertion of the P_BIAS mirror current to transistor Q3 and to transistor Q4 attempts to establish a scaled current from either IOP or ION to the second voltage reference level. Whether one of these currents is established depends upon which, if any, of the control signals are asserted to which of the current sources 400. To turn on first current source 4001, CNTL is deasserted and enable is asserted. To turn on second current source 4002, CNTL is asserted and enable is asserted. To turn on third current source 4003, CNTL is asserted and enable is asserted. To turn on fourth current source 4004, CNTL is deaserted and enable is asserted. Note that deassertion of enable turns off all the current sources 400. Thus, first and third current sources, and second and fourth current sources turn on and off as groups to drive the differential signal as well known. One aspect of the low power mode is that the outputs of IOP and ION sit halfway between the first and second voltage references so that when beginning operation, large currents are not necessary to pull the outputs from one of the voltage reference levels.

Figure 5:
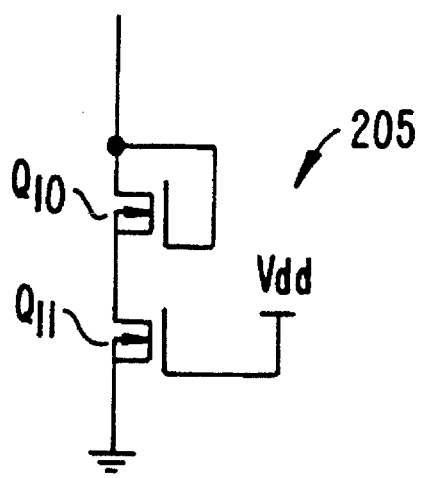
FIG. 5 is a schematic diagram of mirror circuit 205 shown in FIG. 2.

FIG. 5 is a schematic diagram of first mirror circuit 205 shown in FIG. 2. Mirror circuit 205 of the preferred embodiment includes a third N-channel MOSFET Q10 coupled in series to a fourth N-channel MOSFET Q11. A drain and gate of MOSFET Q10 is coupled to the n_bias input for receiving the n_bias input signal while a source of MOSFET Q10 is coupled to a drain of MOSFET Q11. A source of MOSFET Q11 is coupled to the first voltage reference level. Configuring MOSFET Q10 and MOSFET Q11 in this fashion forms one part of the first current mirror. It is one important aspect of the preferred embodiment to closely match transistor Q1 and transistor Q2 of each LSB 300 to MOSFET Q3 in order to complete the current mirror. Additionally, it is an important aspect of the preferred embodiment to closely match transistors of the current sources 4001 and 4002 to transistor Q11.

Figure 6:
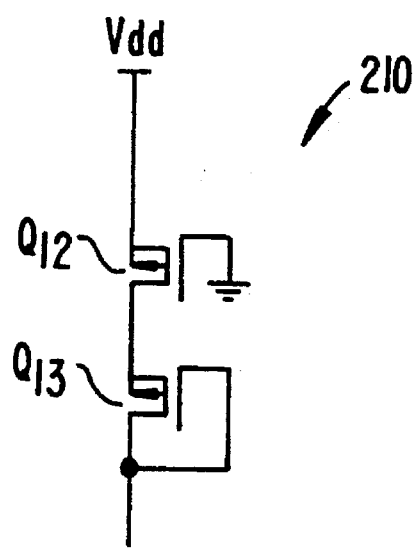
FIG. 6 is a schematic diagram of mirror circuit 210 shown in FIG. 2.

FIG. 6 is a schematic diagram of second mirror circuit 210 shown in FIG. 2. Mirror circuit 210 of the preferred embodiment includes a third p-channel MOSFET Q12 coupled in series to a fourth p-channel MOSFET Q13. A source and gate of MOSFET Q13 is coupled to the p_bias input for receiving the p_bias input signal while a drain of MOSFET Q13 is coupled to a source of MOSFET Q12. A gate of MOSFET Q13 is coupled to the source of MOSFET Q13, while a gate of MOSFET Q12 is coupled to the first voltage reference level. A drain of MOSFET Q12 is coupled to the second voltage reference level. Configuring MOSFET Q12 and MOSFET Q13 in this fashion forms one part of the second current mirror. It is one important aspect of the preferred embodiment to closely match transistor Q3 and transistor Q4 of each LSB 300 to MOSFET Q13 in order to complete the current mirror. Additionally, it is an important aspect of the preferred embodiment to closely match transistors of the current sources 4003 and 4004 to transistor Q12.

In conclusion, the present invention provides a simple, efficient solution to a problem of providing a high-speed, low power DAC for use in wave synthesis when communicating over a twisted pair network. While the above is a complete description of the preferred embodiments of the invention, various alternatives, modifications, and equivalents may be used. Therefore, the above description should not be taken as limiting the scope of the invention which is defined by the appended claims.

What is claimed is:

1. A least significant cell for an integrated digital to analog converter for driving an incremental current at each of a first and a second output node, comprising:

a first pair of matching MOS transistors including a first and second MOS transistor, each transistor having a first terminal node, a second terminal node and a gate terminal node, said gate terminal nodes receiving a first bias current for controlling an operating current between said first terminal node and second terminal node and wherein said first terminal node of said first MOS transistor is coupled to the first output node and said first terminal node of said second MOS transistor is coupled to the second output node;

a first current source having a first current terminal coupled to said second terminal node of said first MOS transistor and a second current terminal coupled to a first voltage reference level, said first current source responsive to a first control signal for switching a first operating current through said first MOS transistor on when said first control signal has a first value and switching said first operating current through said first MOS transistor off when said first control signal has a second value;

a second current source having a first current terminal coupled to said second terminal node of said second MOS transistor and a second current terminal coupled to said first voltage reference level, said second current source responsive to a second control signal for switching a second operating current through said second MOS transistor on when said second control signal has a first value and switching said second operating current through said second MOS transistor off when said second control signal has a second value;

a second pair of matching MOS transistors including a third and fourth MOS transistor, each of said third and fourth transistors having a first terminal node, a second terminal node and a gate terminal node, said gate terminal nodes of said second pair of transistors receiving a second bias current for controlling an operating current between said first terminal node and second terminal node and wherein said first terminal node of said third MOS transistor is coupled to the first output node and said first terminal node of said fourth MOS transistor is coupled to the second output node;

a third current source having a first current terminal coupled to said second terminal node of said third MOS transistor and a second current terminal coupled to a second voltage reference level, said third current source responsive to a third control signal for switching a third operating current through said third MOS transistor on when said third control signal has a first value and switching said third operating current through said third MOS transistor off when said third control signal has a second value; and a fourth current source having a first current terminal coupled to said second terminal node of said fourth MOS transistor and a second current terminal coupled to said second voltage reference level, said fourth current source responsive to a fourth control signal for switching a fourth operating current through said fourth MOS transistor on when said fourth control signal has a first value and switching said fourth operating current through said fourth MOS transistor off when said fourth control signal has a second value.

2. The cell of claim 1 further comprising:

a controller, coupled to said current sources and responsive to an enable signal and a bit control signal, which asserts said first, second, third and fourth control signals.

3. The cell of claim 2 wherein said controller disables each current source when said enable signal is deasserted.

4. The cell of claim 3 wherein said controller turns said first and fourth current sources on and said second and said third current sources off when said bit control signal has a first value and said enable signal is asserted, said controller turns said first and fourth current sources off and said second and said third current sources on when said bit control signal has a second value and said enable signal is asserted.

5. The cell of claim 4 further comprising:

a first impedance coupled between the first output node and said first voltage reference;

a second impedance coupled between the first output node and said second voltage reference;

a third impedance coupled between the second output node and said first voltage reference; and a fourth impedance coupled between the second output node and said second voltage reference.

6. A CMOS digital to analog converter, comprising:

a controller for providing a first and a second bit control signal to collectively identify a desired current output level for a complementary output, said controller providing a first and a second bias current signal, an enable signal and a clock signal;

a first MOS mirror transistor responsive to said first bias current signal to establish a first mirror current at a first mirror current terminal;

a second MOS mirror transistor responsive to said second bias current signal to establish a second mirror current at a second mirror current terminal;

a first and a second synchronizer, one for each bit control signal and each responsive to said clock signal, for concurrently asserting, respectively, a first and a second synchronized bit control signal responsive to said respective bit control signal when said clock signal is asserted;

a first current cell receiving said first synchronized bit control signal, said enable signal and said mirror currents, said first current cell including a first plurality of least significant current cells each responsive to said first bit control signal and to said mirror currents for generating a first complementary output current on said complementary output when said enable signal is asserted; and a second current cell receiving said second synchronized bit control signal and said mirror currents, said second current cell including a second plurality of least significant current cells each responsive to said second bit control signal and to said mirror currents for generating a second complementary output current on said complementary output when said enable signal is asserted.

7. The CMOS digital to analog converter of claim 6 wherein each said least significant current cell comprises:

a first pair of matching MOS transistors including a first and second MOS transistor, each transistor having a first terminal node, a second terminal node and a gate terminal node, said gate terminal nodes receiving said first mirror current for controlling an operating current between said first terminal node and second terminal node and wherein said first terminal node of said first MOS transistor is coupled to the first output node and said first terminal node of said second MOS transistor is coupled to the second output node;

a first current source having a first current terminal coupled to said second terminal node of said first MOS transistor and a second current terminal coupled to a first voltage reference level, said first current source responsive to a first control signal for switching a first operating current through said first MOS transistor on when said first control signal has a first value and switching said first operating current through said first MOS transistor off when said first control signal has a second value;

a second current source having a first current terminal coupled to said second terminal node of said second MOS transistor and a second current terminal coupled to said first voltage reference level, said second current source responsive to a second control signal for switching a second operating current through said second MOS transistor on when said second control signal has a first value and switching said second operating current through said second MOS transistor off when said second control signal has a second value;

a second pair of matching MOS transistors including a third and fourth MOS transistor, each of said third and fourth transistors having a first terminal node, a second terminal node and a gate terminal node, said gate terminal nodes of said second pair of transistors receiving said second mirror current for controlling an operating current between said first terminal node and second terminal node and wherein said first terminal node of said third MOS transistor is coupled to the first output node and said first terminal node of said fourth MOS transistor is coupled to the second output node;

a third current source having a first current terminal coupled to said second terminal node of said third MOS transistor and a second current terminal coupled to a second voltage reference level, said third current source responsive to a third control signal for switching a third operating current through said third MOS transistor on when said third control signal has a first value and switching said third operating current through said third MOS transistor off when said third control signal has a second value; and a fourth current source having a first current terminal coupled to said second terminal node of said fourth MOS transistor and a second current terminal coupled to said second voltage reference level, said fourth current source responsive to a fourth control signal for switching a fourth operating current through said fourth MOS transistor on when said fourth control signal has a first value and switching said fourth operating current through said fourth MOS transistor off when said fourth control signal has a second value.

8. The CMOS digital to analog converter of claim 7 further comprising:

a controller, coupled to said current sources and responsive to said enable signal and said bit control signals, which asserts said first, second, third and fourth control signals.

9. The cell of claim 8 wherein said controller disables each current source when said enable signal is deasserted.

10. The cell of claim 9 wherein said controller turns said first and fourth current sources on and said second and said third current sources off when said bit control signal has a first value and said enable signal is asserted, said controller turns said first and fourth current sources off and said second and said third current sources on when said bit control signal has a second value and said enable signal is asserted.

11. The cell of claim 10 further comprising:

a first impedance coupled between the first output node and said first voltage reference;

a second impedance coupled between the first output node and said second voltage reference;

a third impedance coupled between the second output node and said first voltage reference; and a fourth impedance coupled between the second output node and said second voltage reference.

12. The cell of claim 7 wherein said transistors of said first pair match said first mirror transistor and wherein said transistors of said second pair match said second mirror transistor.

* * * * *